(12) United States Patent
Chou et al.

(10) Patent No.: US 6,455,896 B1
(45) Date of Patent: Sep. 24, 2002

(54) PROTECTION CIRCUIT FOR A MEMORY ARRAY

(75) Inventors: Ming-Hung Chou, Miaoli; Chia-Hsing Chen, Hsin-Chu; Smile Huang, Tainan; Cheng-Jye Liu, Chungli, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/840,898

(22) Filed: Apr. 25, 2001

(51) Int. Cl.[7] .............................................. H01L 23/62
(52) U.S. Cl. ..................... 257/355; 257/328; 257/173
(58) Field of Search ................................ 257/328, 355, 257/363, 402, 173, 368

(56) References Cited

U.S. PATENT DOCUMENTS

| | | | | |
|---|---|---|---|---|
| 4,831,424 A | * | 5/1989 | Yoshida et al. ............... | 257/23 |
| 4,939,616 A | * | 7/1990 | Rountree ...................... | 361/56 |
| 5,262,345 A | * | 11/1993 | Nasser et al. .................. | 437/59 |
| 5,594,265 A | * | 1/1997 | Shimizu et al. .............. | 257/355 |
| 5,751,042 A | * | 5/1998 | Yu ............................... | 257/360 |
| 5,925,922 A | * | 7/1999 | Rountree et al. ........... | 257/536 |
| 6,121,821 A | * | 9/2000 | Miki ........................... | 327/536 |
| 6,236,087 B1 | * | 5/2001 | Daly et al. .................. | 257/355 |
| 6,329,691 B1 | * | 12/2001 | Finzi ........................... | 257/355 |

* cited by examiner

Primary Examiner—Hoai Ho
Assistant Examiner—Andy Huynh

(57) ABSTRACT

The present invention provides a protection circuit comprising one diode wherein the diode is formed by diffusing a heavily doped material of a first conductivity type into a first region of a second conductivity type. An integrated circuit, such as a memory array, is coupled to the diode. The other diode back-to-back is coupled to the diode wherein the other diode is formed by diffusing a heavily doped material of the second conductivity type into the first region and a second region of the first conductivity type. The two diodes in series are capable of discharging for the memory array during manufacturing process.

16 Claims, 2 Drawing Sheets

PROTECTION CIRCUIT FOR A MEMORY ARRAY

BACKGROUND OF THE INVENTION

1. Field of the Invention

The invention relates to a protection circuit, and more particularly to a protection circuit for word lines in a memory array.

2. Description of the Prior Art

A well known cause of failure for electronic integrated circuits is plasma damage on gate devices. For example, during the wiring process, connections can be made which are electrically floating until they are connected again by the last wiring layer. In the meantime, however, electric charge caused, for example, by plasma etching, may accumulate on these floating connections. If one of these connections is coupled to the polygate of a transistor, the charges may leak to the gates via the connections, whereby it may exceed a maximum value and, thus, cause irreparable damage to the gates.

For simple integrated circuits, the charge may be discharged by a parasitic diode through a decoder circuit coupled to a memory array. However, when the integrated circuits are becoming complicated, it is difficult to discharge in time positive or negative charges by exterior decoder circuit.

SUMMARY OF THE INVENTION

It is an object of the present invention to provide a protection circuit for a memory array. Back-to-back diodes are used as a protection circuit can in time discharge positive or negative charges during plasma process.

It is another object of the present invention to provide a protection circuit coupled to multitude of word lines in a memory array. The parallel diodes coupled to the word lines and an in-common diode are arranged in series can save area consumption of the integrated circuits.

It is further object of the present invention to provide a protection structure for a memory array. The protection structure enables the memory array operated under positive or negative voltage.

In the present invention provides a protection circuit comprising one diode wherein the diode is formed by diffusing a heavily doped material of a first conductivity type into a first region of a second conductivity type. An integrated circuit, such as a memory array, is coupled to the diode. The other diode back-to-back is coupled to the diode wherein the other diode is formed by diffusing a heavily doped material of the second conductivity type into the first region and a second region of the first conductivity type. The two diodes in series are capable of discharging for the memory array during manufacturing process.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

While the invention is particularly shown and described with reference to the following preferred embodiment, it will be understood by those skilled in the art that many other modifications and variations may be made thereto without departing from the broader spirit and scope of the invention as set forth in the claims. Use of the disclosed structure or method is not limited to specific memory array. The specification and drawings are according to be regarded as being illustrative, rather than being restrictive.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a protection structure is formed in a semiconductor substrate having a surface. The protection structure protects a memory array and comprises a first deep region of a first conductivity type in the semiconductor substrate and below the surface. A second region of a second conductivity type is surrounded by the first deep region and below the surface. A first diffusion region of the first conductivity type is in the second region and below the surface wherein a first junction is between the first diffusion region and the second region. A second diffusion region of the second conductivity type is below the surface. The second diffusion region is crossed the second region and the first deep region wherein a second junction is between the second diffusion region and the first deep region.

Figure 1A:
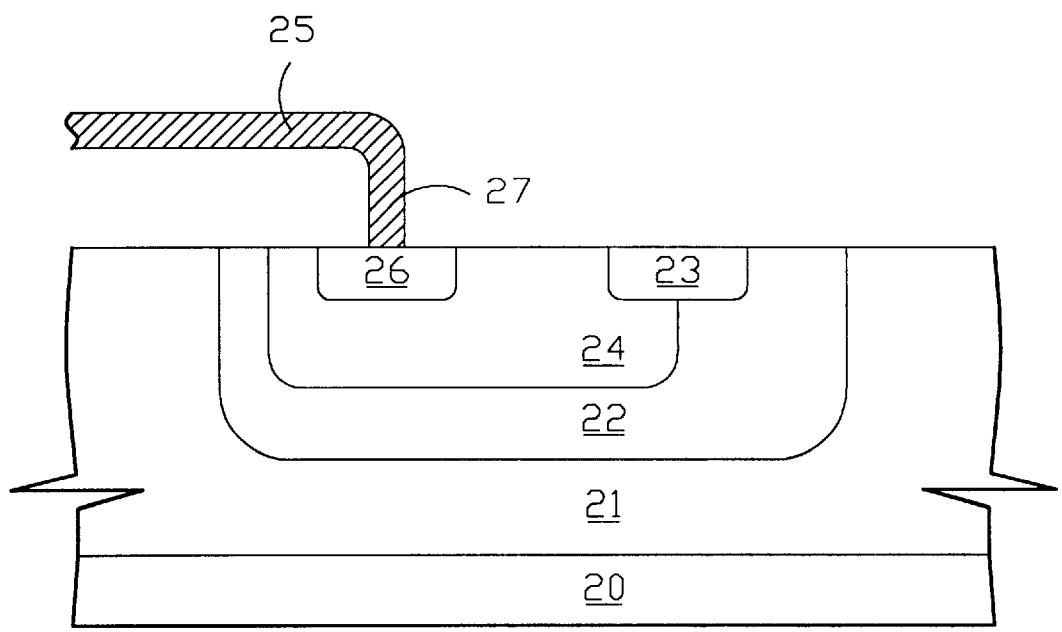
FIG. 1A is a cross-sectional representation of one embodiment illustrating a protection device in accordance with the present invention.
Figure 1B:
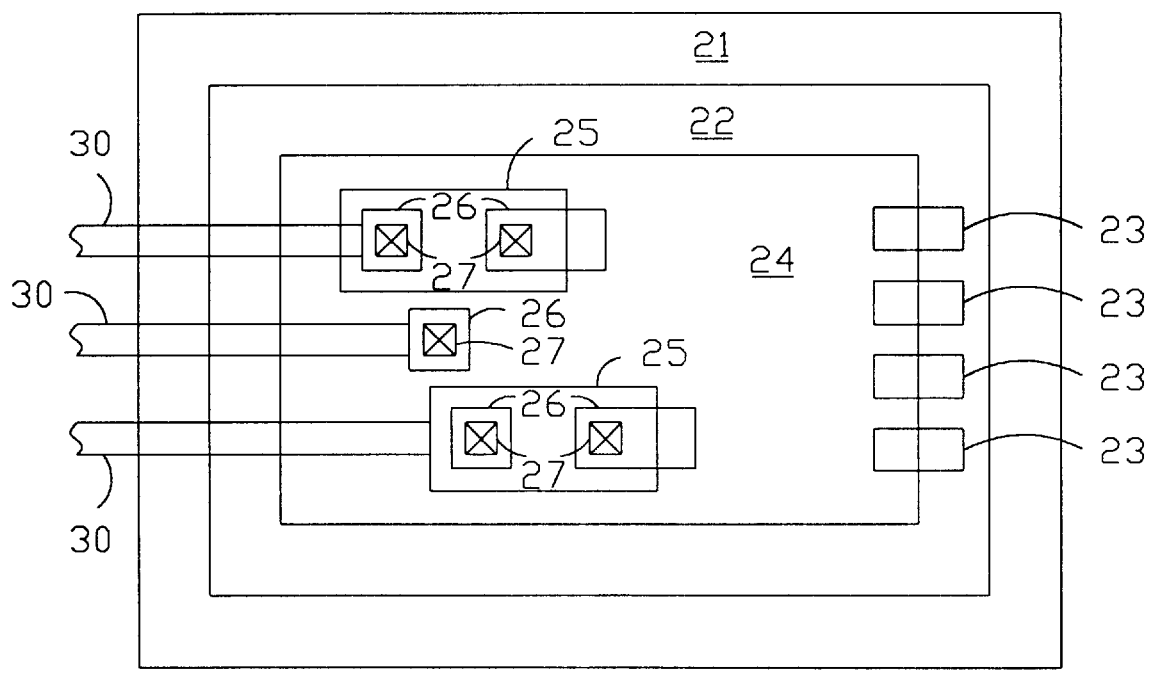
FIG. 1B is a schematic plan view of one embodiment illustrating a part of the memory array coupled to a protection device in accordance with the present invention.
Figure 1C:
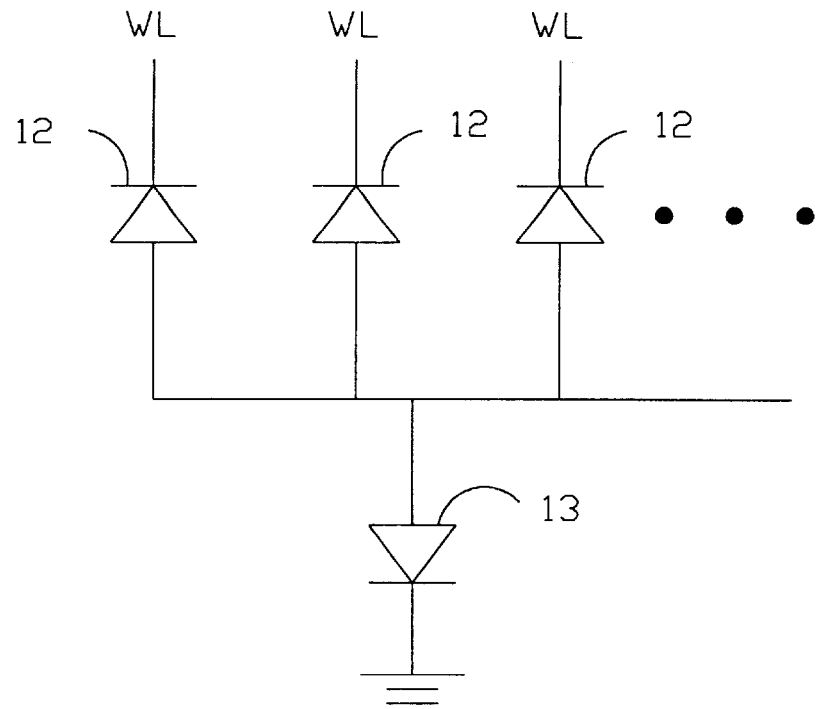
FIG. 1C is a layout representation of FIG. 1B.

One embodiment of the present invention is depicted in FIGS. 1A–1C. FIG. 1A shows a cross-sectional view of the protection circuit illustrating a word line in any memory array coupled to the protection circuit. A semiconductor substrate 20 is provided and a deep P deep well 21 is formed therein. In the embodiment, the semiconductor substrate 20 is grounded. A metal line 25 is coupled to a N+ (high concentration) diffusion region 26 through a contact 27. A P well region 24 is underlay the N+ diffusion region 26. Each N+ diffusion region 26 is coupled to corresponded word line. Thus, a NP diode is formed between the N+ diffusion region 26 and the P well region 24 and coupled to corresponded word line. It is advantageous to prevent cross-talking effect between multitude of word lines.

Further, a deep N well region 22 in the deep P well 21 surrounds the P well region 24 and a P+ (high concentration) diffusion region 23. The P+ diffusion region 23 is crossed both the P well region 24 and the deep N well region 22. Thus, a PN diode is formed between the P+ diffusion region 23 and the deep N well region 22. Each NP diode and the PN diode are arranged in series and back to back. Furthermore, the PN diode may be coupled in common for multitude of NP diodes because the deep N well region 22 is in common. It is advantageous for a memory array to reduce area consumption of protection circuit by using the in-common PN diode. Further, the diodes connected back-to-back normally do not conduct in either direction (forward or backward) and thereby enable the memory array to be operated by either positive or negative voltage.

FIG. 1B is a schematic plan representation of a part of the memory array coupled to a protection circuit in accordance with the present invention. Each N+ diffusion region 26 is coupled to a corresponded word line 30. The word lines 30 in the memory array are arranged in parallel with each another.

Referring to FIG. 1C, the layout diagram illustrates the protection circuit in accordance with the present invention. According to FIG. 1A, a diode 12 is formed between the N+ diffusion region 26 and the P well region 24. One terminal of each diode 12 (NP diode) is coupled to the corresponded word line (WL). The other terminals of the diodes 12 are in common coupled to the diode 13 therewith arranged back to back. The diode 13 (PN diode) is definite between the P+ diffusion region 23 and the deep N well region 22 in FIG. 1A.

Figure 2:
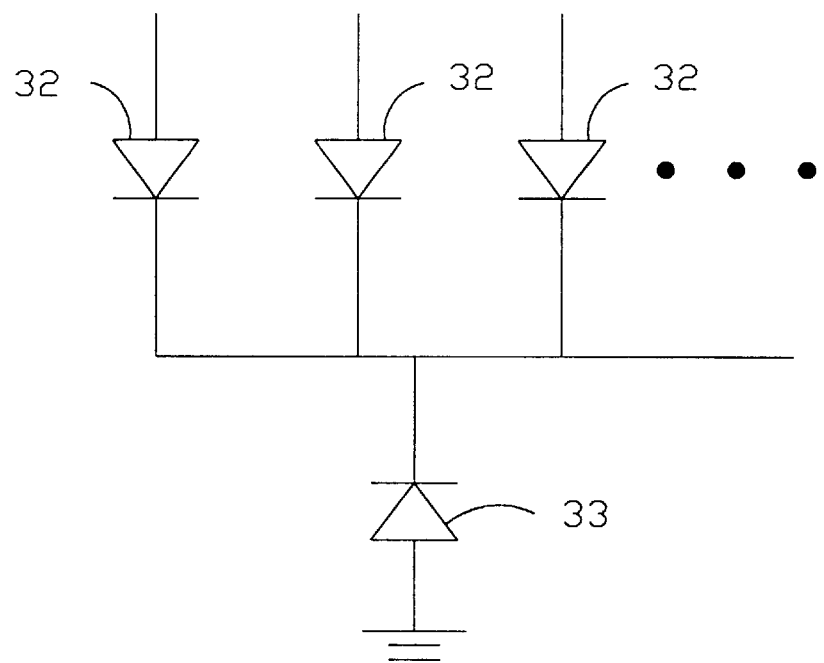
FIG. 2 is a layout of the other embodiment in accordance with the present invention.

FIG. 2 is a layout diagram of the other embodiment. Alternatively, each word line is coupled to a PN diode 32 that is formed between a P+ diffusion region and an N well region. Multitude of PN diodes 32 are in common coupled to an NP diode 33 that is formed between an N+ diffusion region and a deep P well region. The PN diodes 32 and the NP diode 33 are also arranged in series and back to back. A structure for the layout in FIG. 2 is similar to one in FIG. 1A, just to substitute a correspondingly opposite conductivity for one of each region in FIG. 1A.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A protection circuit comprising;
    a plurality of first diodes wherein first said diodes are formed by diffusing a heavily doped material of a first conductivity type into a first region of a second conductivity type;
    an integrated circuit coupled to said first diodes, said integrated circuit for delivering an input signal to said corresponding first diodes, and;
    a second diode back-to-back coupled to said first diodes wherein said second diode is formed by diffusing a heavily doped material of said second conductivity type into said first region and a second region of said first conductivity type.

2. The protection circuit of claim 1, wherein said first diodes and said second diode are connected in series.

3. The protection circuit of claim 1, wherein said integrated circuit comprises a memory array having at least a word line structure for delivering said input signal.

4. The protection circuit of claim 1, wherein said second region is underlay said first region.

5. The protection circuit of claim 1, wherein said second region is located in a well region of said first conductivity that is in a semiconductor substrate.

6. The protection circuit of claim 5, wherein said semiconductor substrate is grounded.

7. The protection circuit of claim 1, wherein said first conductivity is opposite to said second conductivity.

8. A protection structure formed in a semiconductor substrate having a surface, said protection structure protecting a memory array and comprising;
    a first deep region of a first conductivity type in said semiconductor substrate and below said surface;
    a second region of a second conductivity type surrounded by said first deep region and below said first surface;
    a plurality of first diffusion regions of said first conductivity type in said second region and below said surface wherein a plurality of first junctions are between said first diffusion regions and said second region; and
    a second diffusion region of said second conductivity type below said surface, said second diffusion region across said second region and said first deep region wherein a second junction is between said second diffusion region and said first deep region.

9. The protection structure of claim 8, wherein said semiconductor substrate is grounded.

10. The protection structure of claim 8, wherein said memory array comprises a plurality of word line structures coupled to said corresponding first diffusion regions.

11. The protection structure of claim 10, wherein said memory array further comprises said plurality of word line structures arranged in parallel.

12. The protection structure of claim 8, wherein said memory array is operated at a positive voltage.

13. The protection structure of claim 8, wherein said memory array is operated at a negative voltage.

14. The protection structure of claim 8, wherein each of said first junctions and said second junction are connected in series.

15. The protection structure of claim 8, wherein each of said first junctions and said second junction are connected back-to-back.

16. The protection structure of claim 8, wherein said first conductivity type is opposite to said second conductivity type.

* * * * *